United States Patent [19]

Shimizu

[11] Patent Number: 5,094,382
[45] Date of Patent: Mar. 10, 1992

[54] METHOD OF BONDING LEADS TO SEMICONDUCTOR ELEMENTS

[75] Inventor: Nagao Shimizu, Suwa, Japan

[73] Assignee: Seiko Epson Corporation, Tokyo, Japan

[21] Appl. No.: 669,567

[22] Filed: Mar. 14, 1991

[30] Foreign Application Priority Data

Mar. 14, 1990 [JP] Japan .................................. 2-61283

[51] Int. Cl.[5] .......................... H05K 3/32; H01L 21/60
[52] U.S. Cl. .................................. 228/102; 228/180.2; 29/834
[58] Field of Search ................ 228/103, 102, 9, 180.2, 228/49.1; 29/834

[56] References Cited

U.S. PATENT DOCUMENTS 4,342,090  7/1982  Caccoma et al. ...................... 29/834

FOREIGN PATENT DOCUMENTS

| 59-1090 | 1/1984 | Japan | 228/9 |
| 1-150491 | 6/1989 | Japan | 228/9 |
| 2-109346 | 4/1990 | Japan | 228/9 |

OTHER PUBLICATIONS

"Automatic Semiconductor Chip Electrical Test Probe Alignment System," *IBM Tech. Disclosure Bulletin*, vol. 29, No. 6 (11/1986) pp. 2626–2627.

*Primary Examiner*—Richard K. Seidel
*Assistant Examiner*—Jeffrey T. Knapp
*Attorney, Agent, or Firm*—W. Douglas Carothers, Jr.

[57] ABSTRACT

A method for sequentially bonding semiconductor elements to leads formed on TAB type carrier is disclosed. The method provides for the use of the difference between pre and post bonding position recognition values to correct relative pre-positioning of leads and electrodes in successive bonding cycles by sequential learning and thereby obtain improved correction of position slippages between leads and electrodes during bonding.

2 Claims, 8 Drawing Sheets

| | PRE-BONDING RECOGNITION | PRE-BONDING CORRECTION | POST-BONDING RECOGNITION | A | B | C | D |
|---|---|---|---|---|---|---|---|
| | A | C | B | 0 | 0 | 0 | 0 |
| | [img] | | | 100 | 0 | 0 | 0 |
| 1 | | [img] ±0 | | 100 | 0 | 0 | 0 |
| | | | [img] | 100 | 91 | 9 (100−91) | 9 (0+4) |
| | [img] | | | 100 | 91 | 9 | 9 |
| 2 | | [img] +9 ↓ | | 100 | 91 | 9 | 9 |
| | | | [img] | 100 | 100 | 0 (100−100) | 9 (9+0) |
| | [img] | | | 100 | 100 | 0 | 9 |
| 3 | | [img] +9 ↓ | | 100 | 100 | 0 | 9 |
| | | | [img] | 100 | 103 | −3 (100−103) | 6 (9−3) |
| | [img] | | | 100 | 103 | −3 | 6 |
| 4 | | [img] +6 ↓ | | 100 | 103 | −3 | 6 |
| | | (CONTINUED) | | | | | |

FIG.-4

| | | | | | | |
|---|---|---|---|---|---|---|
| 4 | | | ▨ | 100 | 107 | -7<br>(100-107) | -1<br>(6-7) |
| | ▨ | | | 100 | 107 | -7 | -1 |
| 5 | | ▨ ↑<br>-1 | | 100 | 107 | -7 | -1 |
| | | | ▨ | 100 | 100 | 0<br>(100-100) | -1<br>(-1+0) |
| | ▨ | | | 100 | 100 | 0 | -1 |
| 6 | | ▨ ↑<br>-1 | | 100 | 100 | 0 | -1 |
| | | | ▨ | 100 | 98 | 2<br>(100-98) | 1<br>(-1+2) |

FIG.-5

METHOD OF BONDING LEADS TO SEMICONDUCTOR ELEMENTS

BACKGROUND OF THE INVENTION

This invention relates generally to a semiconductor apparatus bonding method and, in particular, to a method of connecting multiple inner leads on tape carrier film to the electrodes of semiconductor elements.

Semiconductor apparatus of the tape carrier (TAB) type form multiple leads for each frame of tape comprising polyimide film or polyester film, join the respective electrodes of a semiconductor element to the tip portions of these leads, i.e. to the inner leads, cutting the tape, and mounting the assembly onto a printed substrate. Such substrates are capable of miniaturization and suitable for high density mounting.

Referring to FIGS. 6 and 7, bonding head 11 is supported so as to be vertically movable on apparatus main member 10. Head 11 may be driven up and down, for example, by a cam and is furnished with bonding tool 12 having a heater within a bonding head constructed so as to be capable of pressing down when driven by an air cylinder. Position recognition apparatus 13 is attached to bonding head 11. Guide plate 14 defines a hole 15 and is attached to bonding head 11. Guide rollers 16, 16a are mounted so as to be rotational on apparatus main member 10 and to direct carrier film along guide plate 14. The film has a length of, for example, 300 m and includes device holes 2 provided at prescribed intervals with multiple leads 3 associated with each hole. Bonding stand 17, furnished on an X-Y table (not illustrated), furnishes bonding stage 18 with an interior heater. Semiconductor element 4 is mounted on bonding stage 18.

Considering operation of a bonding apparatus so constructed, first a semiconductor element 4 is mounted on bonding stage 18, and bonding stand 17 is shifted in X-Y directions so that semiconductor element 4 is set in the proper position under hole 15 of guide plate 14. Carrier film 1 is transported in the direction of the arrow and is guided by guide plate 14 and guide rollers 16, 16a. Film transport stops after initial device hole 2 reaches a prescribed position over semiconductor 4. While being recognized by position recognition apparatus 13, bonding stand 17 and consequently semiconductor element 4 are shifted in X-Y directions. Referring to FIG. 8, electrodes 5 of semiconductor element 14 are positioned to match respective inner leads 3 projecting in device hole 2 of carrier film 1. The position of bonding stand 17, i.e. the position of semiconductor element 4, is stored in control apparatus (not illustrated). Bonding head 11 drops and presses heated bonding tool 12 against each inner lead 3a thereby fusing each lead to a respective electrode 5.

When the first bonding is completed, carrier film 1 is advanced one frame, the next device hole 2 stops in the prescribed position, bonding stand 17 with mounted semiconductor element 4 is positioned under carrier film 1 by a command from the control apparatus, and bonding is accomplished. Bonding is thereafter performed sequentially in the same manner.

In prior art methods of bonding leads to semiconductor elements, the objective is to bond after each inner lead 3a has been correctly positioned on electrodes 5 of semiconductor element 4 employing position recognition apparatus 13. When looking at the actual positional relationship between each inner lead 3a and electrodes 5 of semiconductor element 4, bonding is not always obtained as positioned before bonding. Slippage occurs primarily from limitations in the mechanical precision of bonding tool 12 and of position recognition apparatus 13. Bonding is accomplished with potential slippage in both the lateral (x) and horizontal (y) directions as shown in FIGS. 10 and 11 where broken lines depict position locations before bonding. Such slippage is rarely the same for each bonding cycle, there ordinarily being considerable differences in each cycle because of the mechanical precision of bonding tool 12 or position recognition apparatus 13.

The present invention resolves these and other problems by providing a bonding method capable of correctly positioning and securely joining the inner leads to the electrodes of semiconductor elements.

SUMMARY OF THE INVENTION

According to the present invention, a method of bonding leads to semiconductor elements includes a process of positioning electrodes of a semiconductor element and leads of a carrier film before bonding, detecting position recognition value A of the electrodes and leads following such positioning, bonding the leads to the electrodes, detecting position recognition value B of the electrodes and leads following bonding, detecting the difference between position recognition value A before bonding and position recognition value B after bonding as position correction value C, and correcting the positioning of the electrodes and leads based on the position correction value C before bonding leads of the carrier film and electrodes of the semiconductor elements the next cycle and thereafter.

An alternative method of bonding leads to semiconductor elements according to the present invention includes positioning electrodes of a semiconductor element and leads of a carrier film before bonding, detecting position recognition value A of the electrodes and leads following such positioning, bonding the leads to the electrodes and detecting position recognition value B of the electrodes and leads following such bonding, detecting the difference between position recognition value A following positioning and position recognition value B after bonding as position correction value C, performing initial positioning of the leads and electrodes of the semiconductor element by position correction value D of initial period value 0, basing position correction value D for the next cycle on position correction value C from the previous cycle and position correction amount value D from the next cycle, updating the position correction value sequentially, and correcting the position between the leads and electrodes based on the updated position correction value D following position detection when bonding the carrier film and electrodes of the semiconductor element the next cycle and thereafter.

According to the method of the present invention, the difference between position recognition value A following positioning of the leads of the carrier and electrodes of the semiconductor element and position recognition value B of leads of the electrodes after bonding is taken as position correction value C. Based on position correction value C, positioning correction of the leads of the carrier film and electrodes of the semiconductor elements is made for the next cycle and thereafter, so that in the case of bonding multiple semiconductor elements on long carrier film, position slippages arising between the leads and the electrodes of each semiconductor element are confined within a fixed range in order to make corrections for exact position slippage before and after the next cycle of bonding in each sequentially performed bonding process.

According to another method of the present invention, the electrodes of the semiconductor element and leads of the carrier film are first positioned before first bonding and position recognition value A of the electrodes and leads is detected. Then position recognition value B of the electrodes and leads after bonding is detected, after which the difference between post-positioning position recognition value A and post-bonding position recognition value B is detected as position correction value C.

Thus, when bonding leads of the carrier film to electrodes of the second semiconductor element, position correction for the electrodes and leads is done by position correction value D which is based on value D of the first initial period value D and position correction value C after detecting position recognition value A. After this the electrodes and leads are bonded and post-bonding position recognition value B of the electrodes and leads is detected. Further, the difference between pre-bonding position correction value A and post-bonding position recognition value B is detected as position correction value C in the same manner as before.

When performing bonding of electrodes of the semiconductor element and leads of the carrier film for the third time, after position recognition value A has been detected, position correction of the electrodes and leads employs position correction value D based on second time position correction value C and second time position correction value D, after which bonding of the electrodes and leads is performed.

In this manner, when bonding electrodes of the semiconductor element and leads of the carrier film the second time and thereafter, position correction of the electrodes and leads is accomplished with position correction value D which is always successively updated based on position correction values C and D of the previous cycle so that the accuracy of position correction value D for correction adjustment of the electrodes and leads, is improved by sequential learning from the previous cycle. The magnitude of position correction between electrodes and leads based on such position correction value D decreases and position slippages occurring between leads and electrodes after sequential bonding of the leads and the electrodes of semiconductor elements are also reduced.

According to the method of the present invention the difference between position recognition value A after positioning leads of the carrier film and electrodes of the semiconductor element and position recognition value B of the leads and electrodes after bonding is taken as position correction value C, so that the positioning of the leads of the carrier film and the electrodes of the semiconductor elements for the next cycle and thereafter is accomplished before bonding based on position correction value C. In the case of bonding multiple semiconductor elements to leads of long carrier film, corrections to position slippage during each bonding sequence is made to the exact amount of slippage experienced from previous cycle bonding so that postion slippage occurring between the leads and electrodes of each semiconductor element can be held within a prescribed range, thereby providing a correct position bond of leads to electrodes within a premissible range.

According to another method of the present invention, position correction of the leads and electrodes of the first semiconductor element is accomplished with position correction value D of zero initial value in addition to pre-positioning position recognition value A, post-bonding position recognition value B and position correction value C. Position correction value D for the next cycle is created based on the previous cycle position correction value C and position correction value D from the next cycle, so that position correction value D is serially updated. When bonding the carrier film and the electrodes of semiconductor elements in the next cycle and thereafter, position correction of leads and electrodes is accomplished based on updated position correction value D after detecting position recognition value A, so that position correction value D for correcting positions of leads of the carrier film and electrodes of the semiconductor elements is successively created in each cycle thereafter so as to achieve good precision from previous cycle learning. The position correction value for leads and electrodes based on position correction value D becomes smaller and position slippage occurring between the leads and electrodes of serially bonded semiconductor elements is reduced, so that bonding is obtained in the correct positions. Bonding reliability is consequently increased thereby substantially increasing yields.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 4 is a schematic diagram depicting position correction according to the present invention.

FIG. 5 is a schematic diagram continuing the position correction depiction of FIG. 4.

DESCRIPTION OF THE INVENTION

Figure 1:
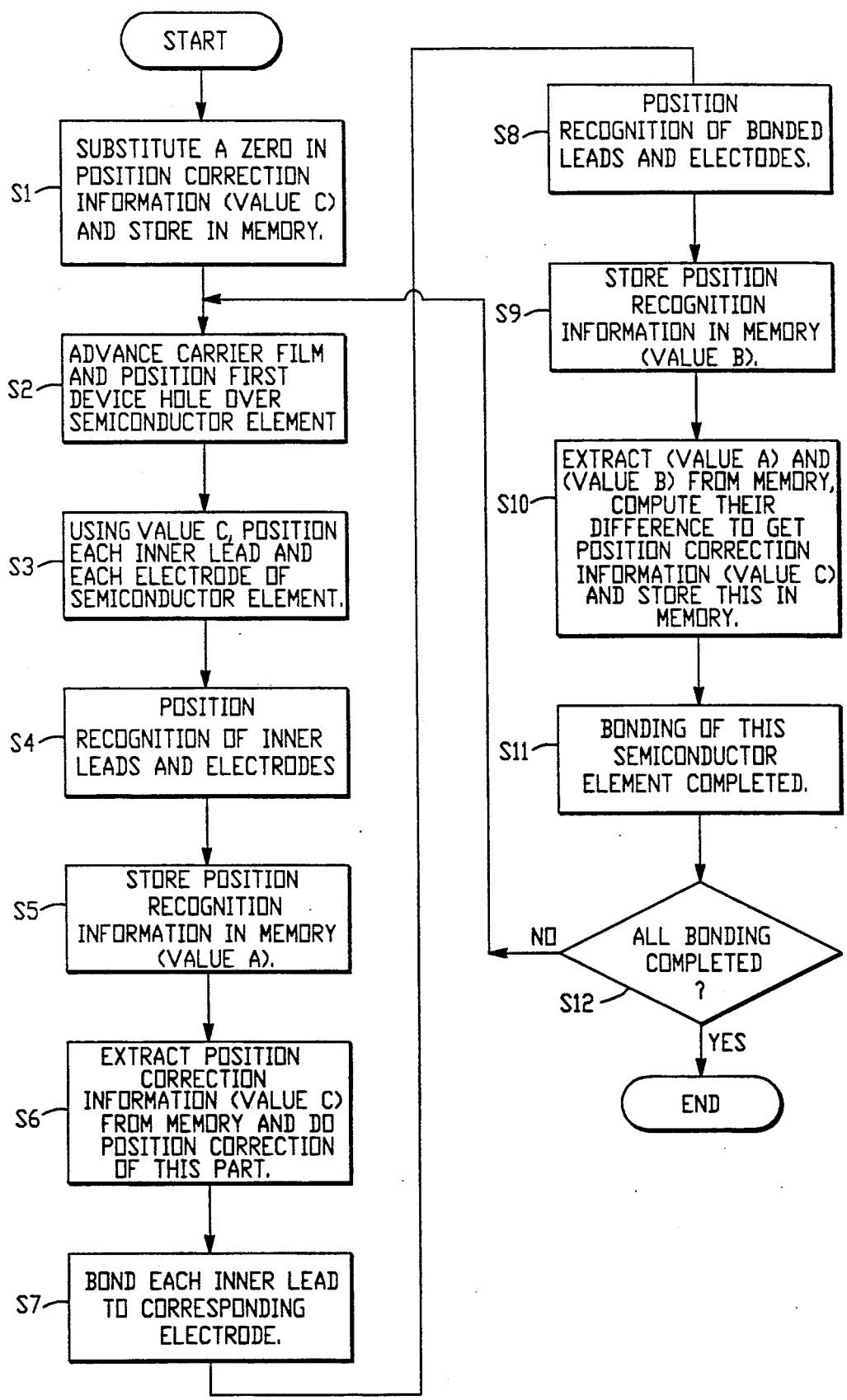
FIG. 1 is a flowchart depicting a portion of an exemplary method according to the present invention.

Referring to the flowchart of FIG. 1, an exemplary bonding method according to the present invention includes the following steps:

(S1) a zero is substituted in the position correction value C of the control apparatus and is stored in memory;

(S2) bonding stand 17 is shifted to position semiconductor element 4 on bonding stage 18 under hole 15 of guide plate 14, carrier film 1 is advanced and first device hole 2a is positioned over semiconductor element 4;

(S3) positioning of each inner lead 3a of device hole 2a and each electrode 5 of semiconductor element 4 is done by shifting bonding stand 17 in X-Y directions according to value C;

(S4) position recognition of each inner lead 3a and each electrode 5 is done by position recognition apparatus 13;

(S5) position recognition information recognized in Step S4 is taken as value A and stored in memory;

(S6) position correction value C is extracted from memory and position correction is done by value A recognized in Step S5;

(S7) bonding tool 12 drops, contacts each inner lead 3a, and they are heated and pressed to bond them respectively to each electrode 5.

(S8) position recognition of each inner lead 3a and each electrode 5 is done after bonding employing position recognition apparatus 13;

(S9) position recognition value recognized at Step S8 is taken as value B and stored in memory;

(S10) value A recognized in Step S5 and value B recognized in Step S9 are extracted from memory, and the difference between the two, i.e. the slippage, is calculated to obtain position correction value C stored in memory;

(S11) current cycle bonding is complete; and (S12) it is decided whether or not all bonding of carrier film 1 has been completed, when YES all bonding is completed, and when NO the flow moves again to Step S2 and the operation steps are repeated.

In the above-described manner, the present invention provides position recognition for inner leads 3a and electrodes 5 before bonding inner leads 3a of carrier film 1 to electrodes 5 of semiconductor element 4 to obtain position recognition value A. Following bonding, position recognition of inner leads 3a and electrodes 5 is repeated to obtain position recognition value B. The difference between values A and B is calculated to obtain position slippage from the pre-bonding position caused by bonding. This is taken as position correction value C. When bonding the next semiconductor element 4, positioning of inner leads 3a and electrodes 5 is accomplished employing position correction value C, so that correction of position slippage according to the magnitude and direction of position slippage before bonding and after bonding in the prior cycle is accomplished serially for each bonding. Slippage between the leads and electrodes is suppressed to a specific range by such correction so as to connect inner leads 3a at positions on electrodes 5 within a specific permissible range.

Figure 2:
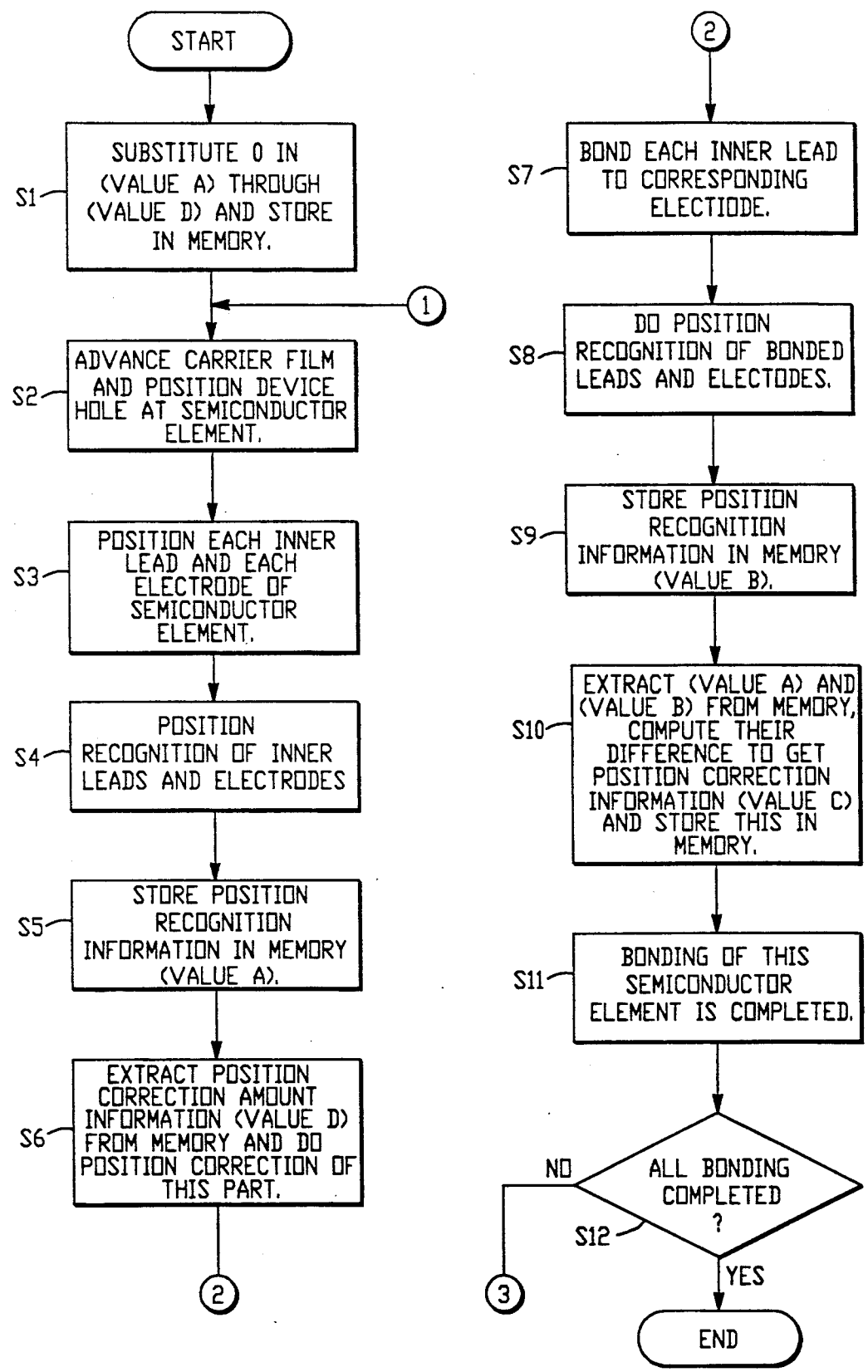
FIG. 2 is a flowchart depicting a portion of an alternative method according to the present invention.
Figure 3:
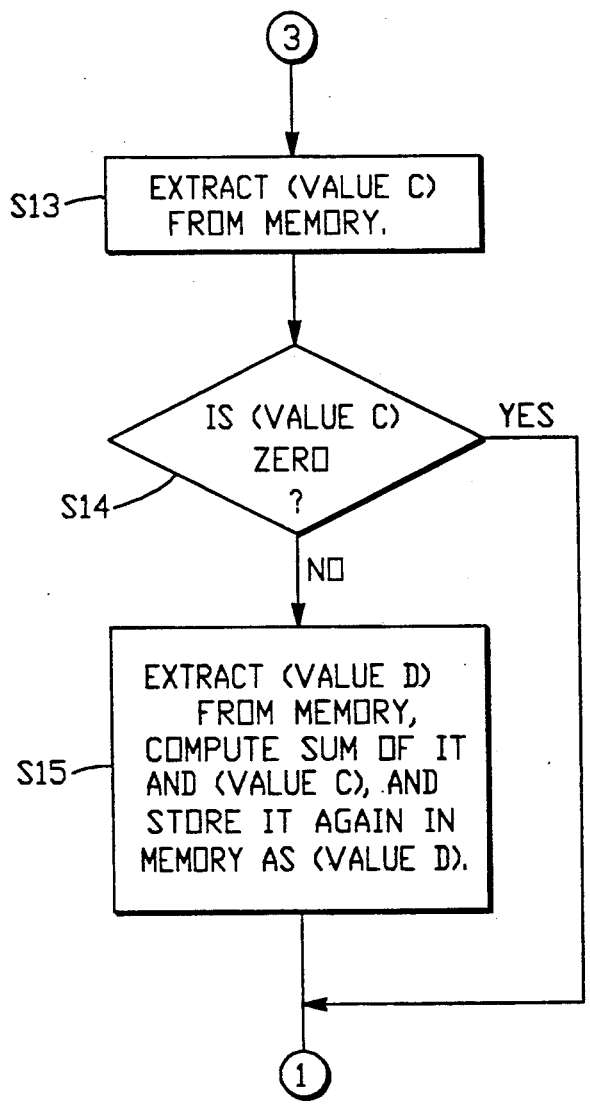
FIG. 3 is a flowchart depicting a continuation of the flowchart of FIG. 2.

Referring to FIGS. 2 and 3 exemplary procedures for an alternative bonding method according to the present invention includes the following steps:

(S1) zeros are substituted for all values A through D in the control apparatus and are stored in memory;

(S2) bonding stand 17 is shifted to position semiconductor element 4 on bonding stage 18 under hole 15 of guide plate 14, carrier film 1 is transported and the first device hole 2a is positioned over semiconductor element 4;

(S3) positioning of each inner lead 3a of device hole 2a and each electrode 5 of semiconductor element 4 is done by shifting bonding stand 17 in X-Y directions;

(S4) position recognition of each inner lead 3a and each electrode 5 is done by position recognition apparatus 13;

(S5) position recognition values recognized at step S4 are taken as values A and stored in memory;

(S6) position correction value D is extracted from memory and position correction is done for the state in Step S4;

(S7) bonding tool 12 is dropped so as to contact, heat and press each inner lead 3a to bond a respective electrode 5;

(S8) position recognition of each inner lead 3a and each electrode 5 is done after bonding is completed by means of position recognition apparatus 13;

(S9) position recognition information recognized in Step S8 is taken as value B and stored in memory;

(S10) value A recognized in Step S5 and value B recognized in Step S9 are extracted from memory, and the difference between the two, i.e. the slippage, is calculated to obtain position correction value C which is stored in memory;

(S11) bonding is performed;

(S12) it is decided whether or not all bonding of carrier film 1 has been completed, and if YES bonding is completed (conventionally the decision whether or not bonding has been completed is made by employing a signal from a present-absent sensor, not illustrated, for carrier film 1;

(S13) if the decision of step S12 is NO the position correction value C is extracted from memory;

(S14) it is decided whether or not value C is zero, and if YES the position correction amount used for the position correction done in Step S6 (value D) operates correctly, so that the flow moves again to Step S2 without executing Step S15, and the above-described operations are repeated;

(S15) if the decision of Step S14 is a NO there is a need to correct the position correction value D, so the position correction value D is extracted from memory, and the sum of it and position correction value C is calculated to obtain a new position correction value D which is stored in memory and the flow shifts again to Step S2 and the operations described above are repeated.

The specific procedures of the alternative bonding method according to the present invention will be explained with reference to FIGS. 4 and 5. In the figures, pre-bonding position recognition value A, post-bonding position recognition value B, position correction value C is the difference between pre-bonding value A and post-bonding value B, and position correction value D based on position correction information C and position correction value D of the prior cycle is successively updated. The slanted line portions depict the bump positions of leads 3, the single-dotted lines indicate the pad centers that are electrodes 5 of semiconductor 4, and the double-dotted lines designate the bump centers of inner leads 3. For purposes of explanation, the position slippage between the bumps of leads 3 and electrodes 5 of semiconductor element 4 are given only in the longitudinal direction (Y direction) of the leads.

First, initial period values of zero are substituted in value A through D in the control apparatus and are stored in memory. Next, first positioning of leads 3 and electrodes 5 of semiconductor element 4 is accomplished before bonding. The position recognition value for leads 3 and electrodes 5 is detected. Position recognition value A at this time is 100. Because value D has its initial period value at zero, bonding of leads 3 and electrodes 5 is done at once, without a positioning correction before bonding. After this, post-bonding position recognition value B for leads 3 and electrodes 5 is detected. Information recognition value B at this time is 91. At this point, since value C is the difference between values A and B, i.e. 100−91 or 9, and since value D is the sum of values C and D of the previous cycle (its initial value is zero at this time) and is 0+9, value D is updated from 0 to 9.

When bonding between leads 3 and electrodes 5 of first semiconductor element 4 has been completed, bonding of leads 3 and electrodes 5 of second semiconductor element 4 is accomplished. In this case, positioning of leads 3 and electrodes 5 is done before bonding, after which the position recognition value for leads 3 and electrodes 5 is detected. Value A at this time is 100, so value D is 9. This indicates that bonding is completed with correct positioning and that a position slippage of exactly 9 occurs. Consequently since position correction value D becomes 9, position correction of exactly 9 is done, after which bonding may be done. When post-bonding value B is detected, value B is 100. This indicates that position correction was correctly done based on the value D of 9. Value C at this time is 100−100 or zero and value D is 9+0, so that value D has again been updated to 9.

Next, bonding is executed for leads 3 and electrodes 5 of third semiconductor element 4. Here value A is 100 in the same manner as for the previous bonding. Since value D is 9, bonding is done after a position correction of exactly 9. Looking at post-bonding value B, since it is 103, value C is 100−103 or −3 and value D is 9−3 and so updated to 6. When bonding of leads 3 and electrodes 5 of fourth semiconductor element 4 is completed, bonding occurs following a position correction based on value D of 6.

Figure 6:
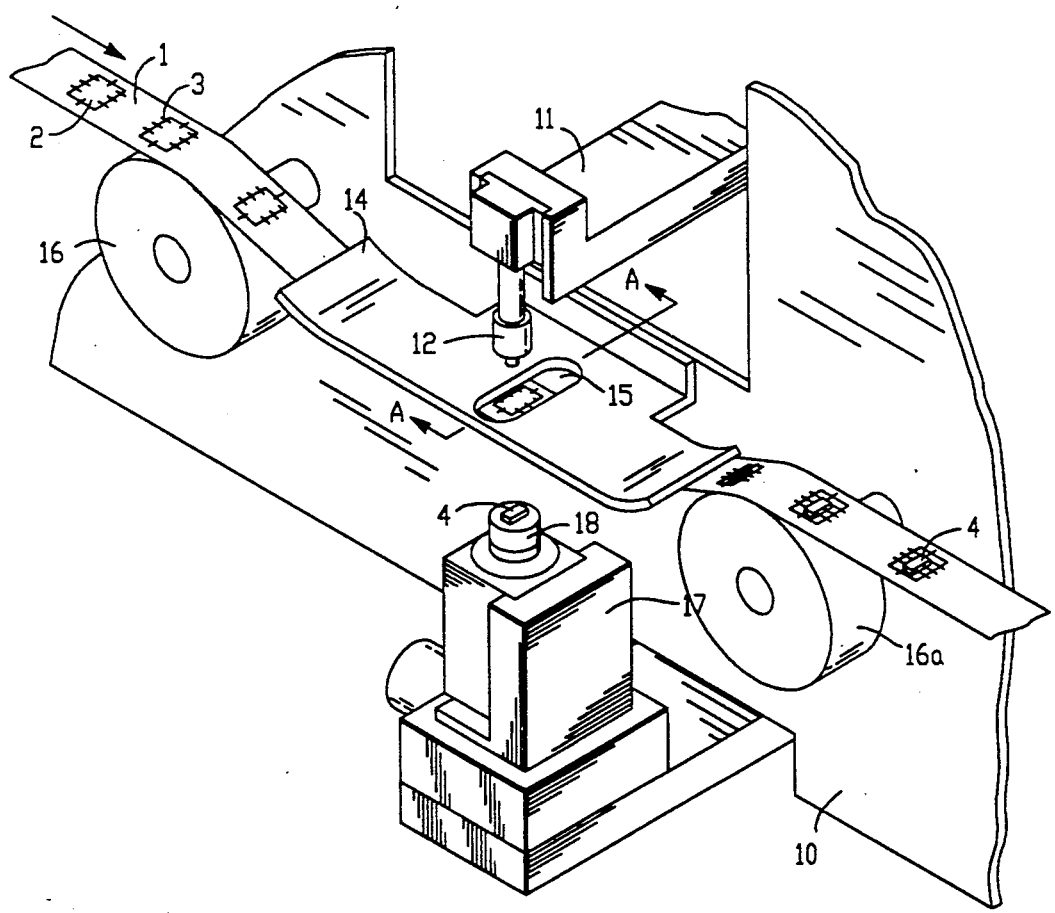
FIG. 6 is a perspective view of exemplary inner lead bonding apparatus according to the present invention.
Figure 7:
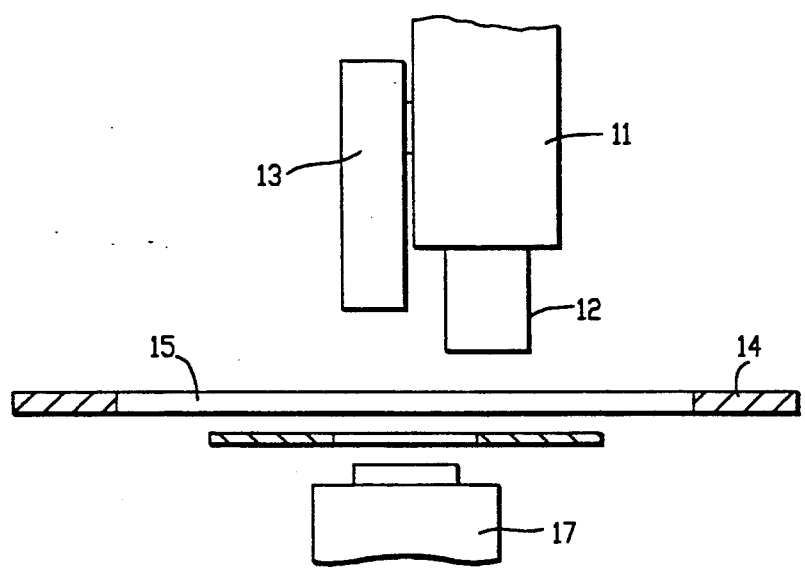
FIG. 7 is a sectional view taken along line A—A of FIG. 6.
Figure 8:
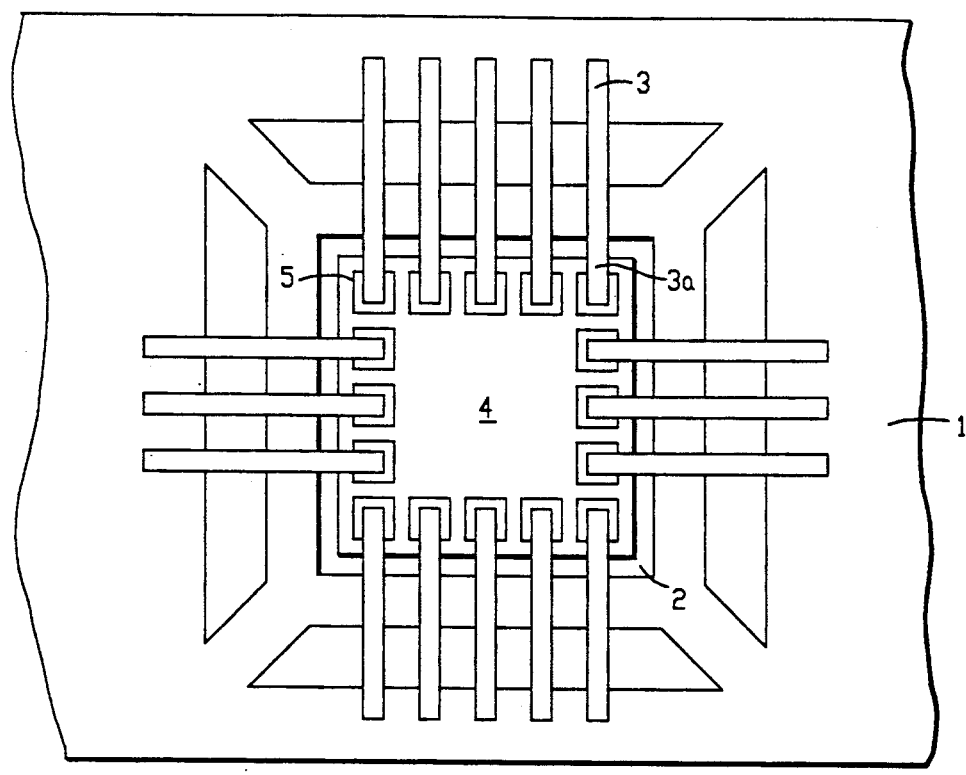
FIG. 8 is a plan view depicting carrier film leads correctly bonded to a semiconductor element.
Figure 9:
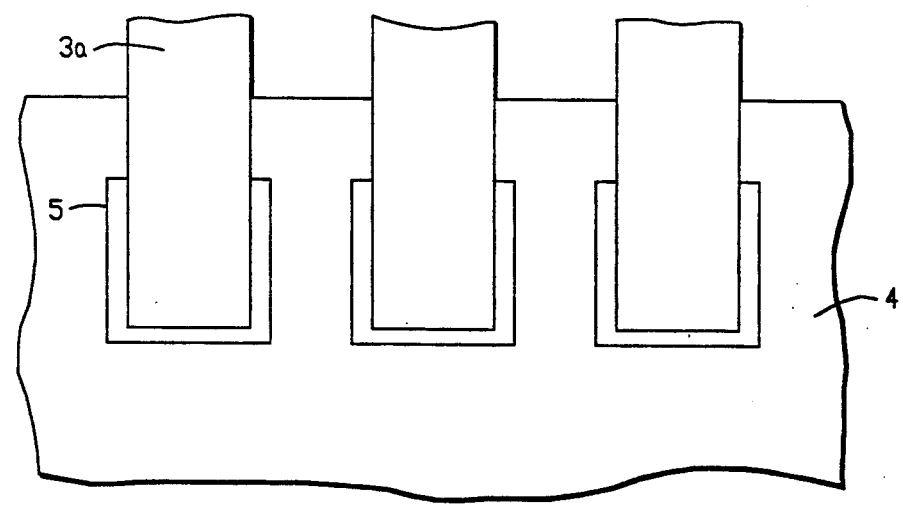
FIG. 9 is an exploded view of selected bonding connections of FIG. 8.
Figure 10:
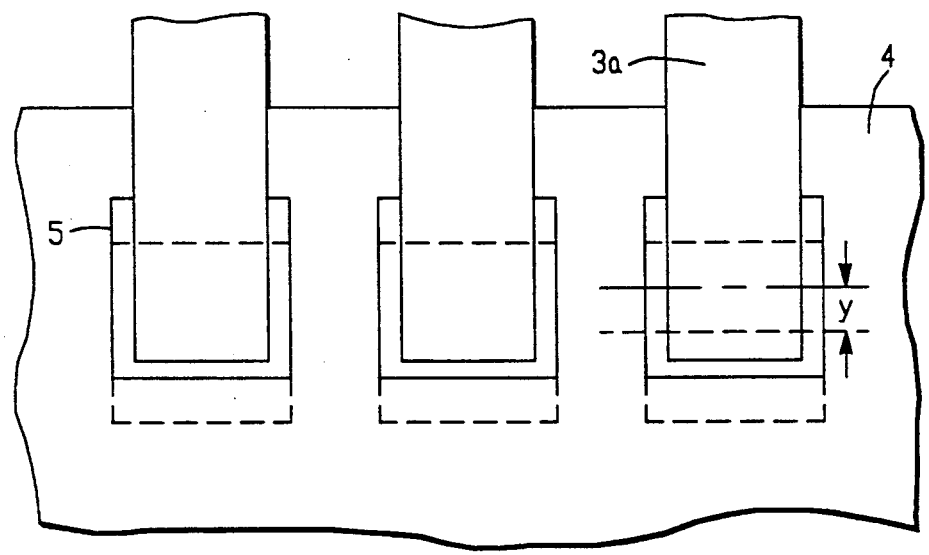
FIG. 10 is a plan view depicting position slippage along the Y axis of carrier film leads bonded to a semiconductor element by prior art methods.
Figure 11:
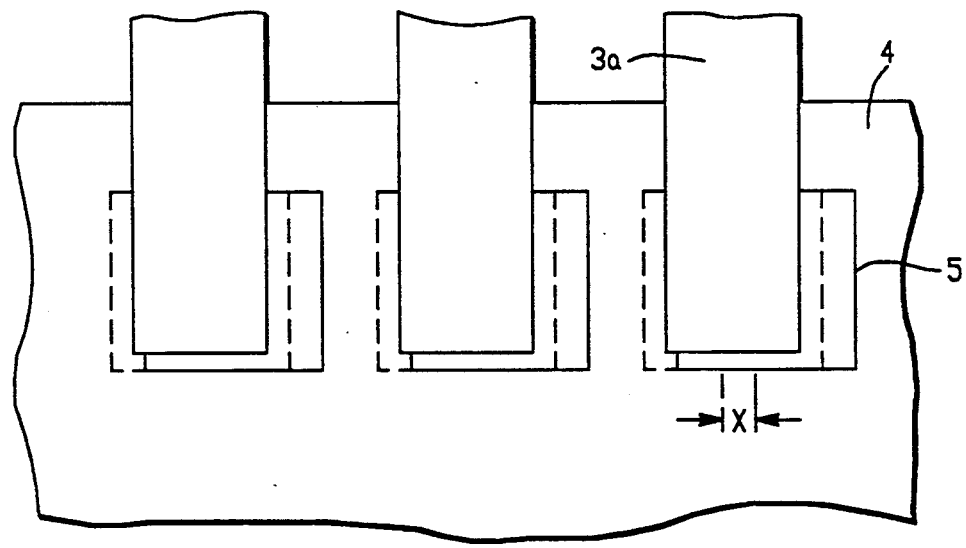
FIG. 11 is a plan view depicting position slippage along the X axis of carrier film leads bonded to a semiconductor element by prior art methods.

After this, bonding of leads 3 and electrodes 5 of semiconductor elements 4 to 6 in FIGS. 5 and 6 is implemented using the same procedures. Since value D is the position correction value for the next cycle and is successively updated based on the position correction of the previous cycle, position correction value D becomes smaller and the position slippage occurring after bonding between the leads and electrodes of the series of semiconductor elements decreases, and inner leads 3a of leads 3 are correctly connected to electrodes 5 of semiconductor elements 4.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A method of successive bonding cycles each comprising the bonding of semiconductor elements to leads provided on a carrier film by obtaining a position correction value based upon the difference between recognized pre-bonding and post-bonding positions established during a bonding cycle and comprising:
  a. providing a long carrier film having a plurality of leads and a plurality of locations for receiving a semiconductor element;
  b. providing a semiconductor element having electrodes;
  c. positioning said carrier film and semiconductor element for bonding of said leads to said electrodes at a selected one of said locations;
  d. correcting the relative positioning of said electrodes and leads in step c based on a previously determined position correction value;
  e. detecting the relative pre-bonding position of said electrodes and leads;
  f. bonding said leads to said electrodes;
  g. detecting the relative post-bonding position of said electrodes and leads; and
  h. determining the difference between said pre-bonding and post-bonding positions to form a new position correction value for use in step d in the next succeeding bonding cycle.

2. A method of successive bonding cycles each comprising the bonding of semiconductor elements to leads provided on a carrier film by obtaining an updated value based upon the difference between a previously determined updated value and a position correction value determined from the difference between recognized pre-bonding and post-bonding positions established during a bonding cycle and comprising:
  a. providing a semiconductor element having electrodes;
  b. providing a carrier film having one or more leads and a location for receiving said semiconductor element;
  c. positioning said electrodes and leads for bonding based upon a previously updated value which in the case of the first bonding cycle is assigned a value of zero;
  d. correcting the relative positioning of said electrodes and leads in step c based on a previously determined position correction value;
  e. detecting a value based upon the relative positions of the electrodes and leads following step d except in the case of the first bonding cycle wherein the value is assigned zero;
  f. bonding said leads to said electrodes;
  g. detecting a value based upon the relative positions of said electrodes and leads following step f;
  h. determining the difference between the values of the relative positions of steps e and g to form a new position correction value; and
  i. determining a new updated value based upon the difference between the value determined in step d and the value determined in step h.

* * * * *